(12) United States Patent
Lin et al.

(10) Patent No.: US 10,027,300 B2
(45) Date of Patent: Jul. 17, 2018

(54) AMPLIFIER SYSTEM, CONTROLLER OF MAIN AMPLIFIER AND ASSOCIATED CONTROL METHOD

(71) Applicant: MEDIATEK INC., Hsin-Chu (TW)

(72) Inventors: Lai-Ching Lin, Hsinchu County (TW); Ming-Da Tsai, Miaoli County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/241,035

(22) Filed: Aug. 18, 2016

(65) Prior Publication Data

US 2017/0141748 A1    May 18, 2017

Related U.S. Application Data

(60) Provisional application No. 62/254,191, filed on Nov. 12, 2015.

(51) Int. Cl.

| H03F 1/22 | (2006.01) |
|---|---|
| H03G 3/30 | (2006.01) |
| H03F 3/193 | (2006.01) |
| H03F 3/21 | (2006.01) |
| H03K 5/1532 | (2006.01) |
| H03F 1/52 | (2006.01) |
| H03F 3/195 | (2006.01) |

(Continued)

(52) U.S. Cl.
CPC ........... *H03G 3/3042* (2013.01); *H03F 1/223* (2013.01); *H03F 1/523* (2013.01); *H03F 3/193* (2013.01); *H03F 3/195* (2013.01); *H03F 3/21* (2013.01); *H03F 3/245* (2013.01); *H03F 3/45179* (2013.01); *H03F 3/45475* (2013.01); *H03F 3/72* (2013.01); *H03K 5/1532* (2013.01); *H03F 2200/108* (2013.01); *H03F 2200/153* (2013.01); *H03F 2200/18* (2013.01); *H03F 2200/228* (2013.01); *H03F 2200/234* (2013.01); *H03F 2200/258* (2013.01); *H03F 2200/301* (2013.01); *H03F 2200/393* (2013.01); *H03F 2200/435* (2013.01); *H03F 2200/441* (2013.01); *H03F 2200/451* (2013.01); *H03F 2200/462* (2013.01); *H03F 2200/471* (2013.01); *H03F 2200/477* (2013.01); *H03F 2200/481* (2013.01); *H03F 2200/498* (2013.01); *H03F 2200/555* (2013.01); *H03F 2200/75* (2013.01); *H03F 2200/78* (2013.01)

(58) Field of Classification Search
CPC  H03F 1/22; H03F 1/223; H03F 1/226; H03G 3/3036; H03G 3/3042
USPC .......................................... 330/311, 133, 285
See application file for complete search history.

(56) References Cited

U.S. PATENT DOCUMENTS

| 4,547,746 A | 10/1985 | Erickson |
|---|---|---|
| 6,137,366 A | 10/2000 | King |

(Continued)

*Primary Examiner* — Steven J Mottola
(74) *Attorney, Agent, or Firm* — Winston Hsu

(57) ABSTRACT

The present invention provides a control circuit to stabilize an output power of a power amplifier. The control circuit comprises a voltage clamping loop, a current clamping loop and a loop for reducing power variation under VSWR, where the voltage clamping loop is used to clamp an output voltage of the power amplifier within a defined voltage range, the current clamping loop is used to clamp a current of the power amplifier within a defined current range, and the loop for reducing power variation under VSWR is implemented by an impedance detector to compensate the output power under VSWR variation.

31 Claims, 3 Drawing Sheets

(51) Int. Cl.
*H03F 3/24* (2006.01)
*H03F 3/45* (2006.01)
*H03F 3/72* (2006.01)

(56) References Cited

U.S. PATENT DOCUMENTS

| | | |
|---|---|---|
| 6,417,732 B1 * | 7/2002 | Radomski .............. H03F 1/345 330/207 P |
| 7,109,897 B1 | 9/2006 | Levesque |
| 7,486,137 B2 | 2/2009 | Magoon et al. |
| 7,649,411 B2 | 1/2010 | Aoki et al. |
| 7,710,204 B2 | 5/2010 | Karoui et al. |
| 8,749,309 B2 | 6/2014 | Ho et al. |
| 2006/0017538 A1 | 1/2006 | Magoon |
| 2008/0211585 A1 | 9/2008 | Karoui |
| 2012/0139636 A1 * | 6/2012 | Scott ................... H03G 3/3042 330/285 |
| 2012/0139643 A1 | 6/2012 | Scott |
| 2015/0280672 A1 * | 10/2015 | Ding ................... H03G 3/3036 375/345 |
| 2016/0197586 A1 * | 7/2016 | Ripley ..................... H03F 1/22 330/296 |

\* cited by examiner

AMPLIFIER SYSTEM, CONTROLLER OF MAIN AMPLIFIER AND ASSOCIATED CONTROL METHOD

CROSS REFERENCE TO RELATED APPLICATIONS

This application claims the priority of U.S. Provisional Application No. 62/254,191, filed on Nov. 12, 2015, which is included herein by reference in its entirety.

BACKGROUND

In a radio frequency (RF) transmitter, an output power of a power amplifier is related to an output impedance (including a load impedance) of the power amplifier. Because the load impedance may be varied due to a voltage standing wave ratio (VSWR) variation caused by proximity of an antenna to foreign objects, the output power of the power amplifier may be varied accordingly. The output power variation may decrease a quality of service and/or increase a peak current/voltage of the power amplifier. Therefore, how to design a controller to control the power amplifier to stabilize the output power is an important topic.

SUMMARY

It is therefore an objective of the present invention to provide an amplifier system, a controller of a main amplifier and associated control method, which controls a cascode power amplifier according to an output signal and an output current, to solve the above-mentioned problem.

According to one embodiment of the present invention, an amplifier system comprises a main amplifier and a controller. The main amplifier comprises a first transistor and a second transistor connected in cascode, wherein the main amplifier amplifies an input signal received at agate electrode of the first transistor to generate an output signal at a drain electrode of the second transistor. The controller is coupled to the main amplifier, and is arranged for generating a control signal to a gate electrode of the second transistor according to the output signal and a current of the main amplifier, to control a gain of the main amplifier.

According to another embodiment of the present invention, a method for controlling a main amplifier, wherein the main amplifier comprises a first transistor and a second transistor connected in cascode, the main amplifier amplifies an input signal received at a gate electrode of the first transistor to generate an output signal at a drain electrode of the second transistor, and the method comprises: generating a control signal to a gate electrode of the second transistor according to the output signal and a current of the main amplifier, to control a gain of the main amplifier.

According to another embodiment of the present invention, Circuits for controlling a main amplifier is provided, wherein the main amplifier comprises a first transistor and a second transistor connected in cascode, the main amplifier amplifies an input signal received at a gate electrode of the first transistor to generate an output signal at a drain electrode of the second transistor. The circuits comprises a controller, which is arranged for generating a control signal to a gate electrode of the second transistor according to the output signal and a current of the main amplifier, to control a gain of the main amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
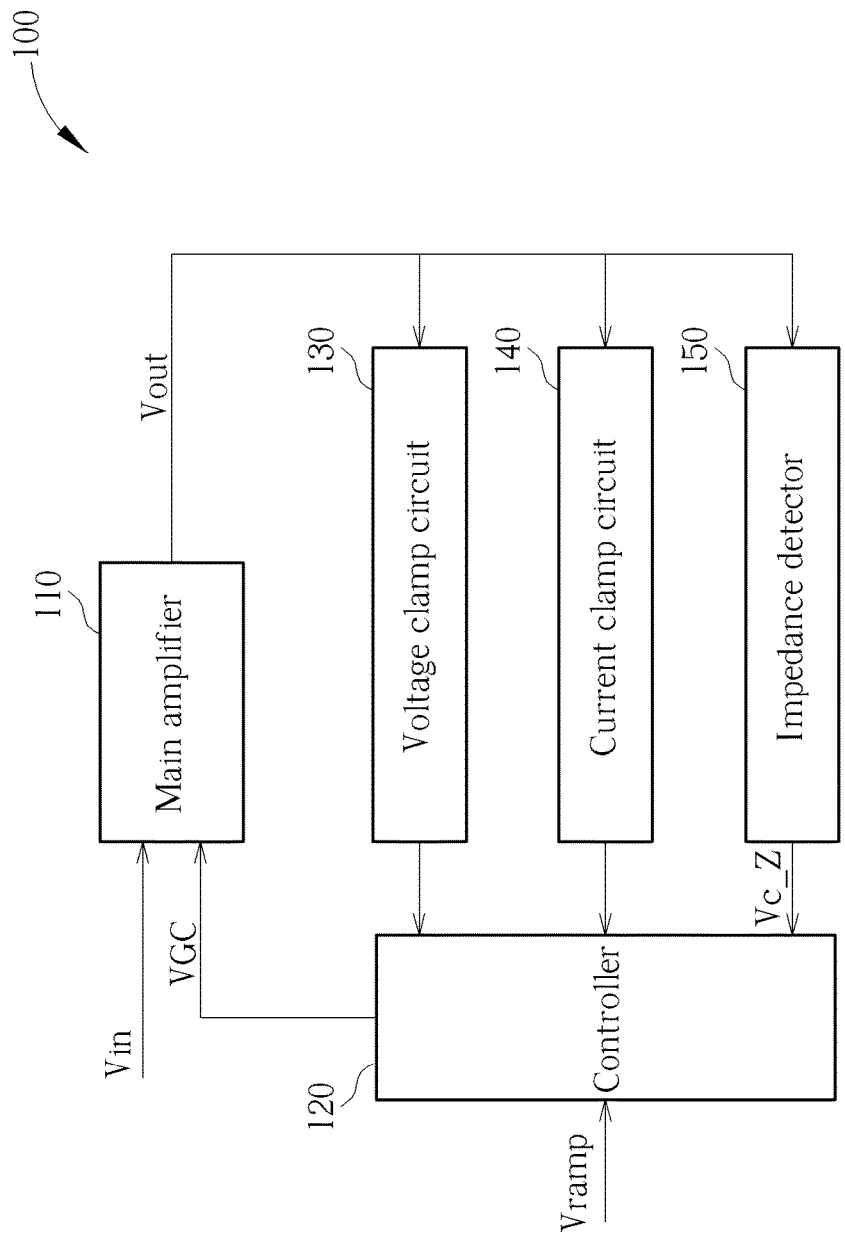
FIG. 1 is a diagram illustrating an amplifier system according to one embodiment of the present invention.

Please refer to FIG. 1, which is a diagram illustrating an amplifier system 100 according to one embodiment of the present invention. As shown in FIG. 1, the amplifier system 100 comprises a main amplifier (power amplifier) 110, a controller 120, a voltage clamp circuit 130, a current clamp circuit 140 and an impedance detector 150. The main amplifier 110 is configured to amplify an radio frequency (RF) input signal Vin to generate an RF output signal Vout; the controller 120 is configured to receive a power indication signal Vramp to generate a control signal VGC to control a gain of the main amplifier 110; the voltage clamp circuit 130 is configured to adjust the control signal VGC outputted by the controller 120 according an amplitude of the output signal Vout; the current clamp circuit 140 is configured to adjust the control signal VGC outputted by the controller 120 according a current of the main amplifier 110; and the impedance detector 150 is configured to detect an output impedance of the main amplifier 110 to generate a detection result Vc_Z, and the controller 120 further refers to the detection result Vc_Z to generate the control signal VGC. In this embodiment, the amplifier system 100 is applied to a transmitter, and the output signal Vout is broadcasted by using an antenna coupled to the main amplifier 110.

Figure 2:
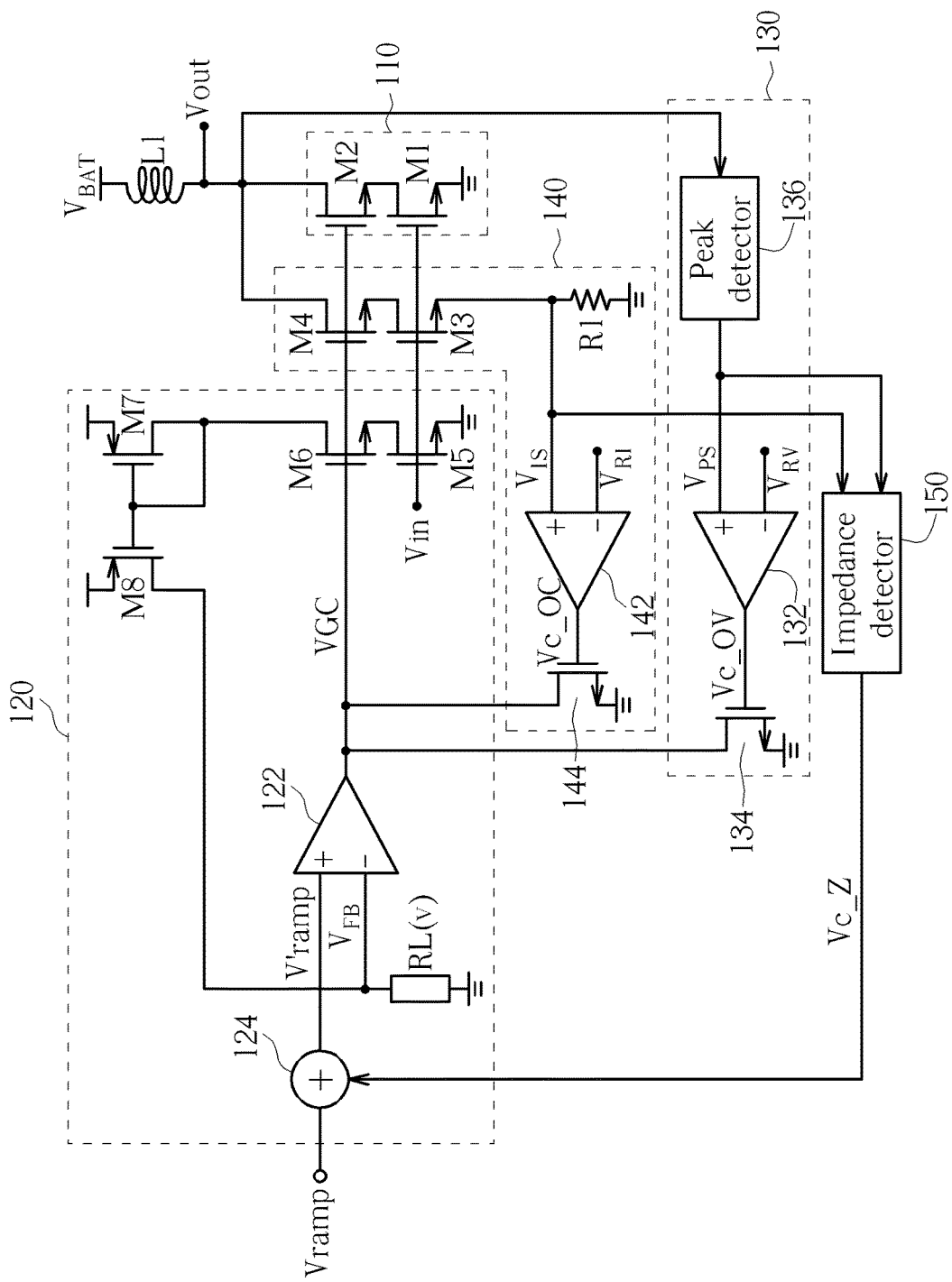
FIG. 2 is a diagram illustrating a detail structure of the amplifier system according to one embodiment of the present invention.

Please refer to FIG. 2, which is a diagram illustrating a detail structure of the amplifier system 100 according to one embodiment of the present invention. In FIG. 2, the main amplifier 110 is implemented by two NMOSs M1 and M2 connected in cascode, the main amplifier 110 is supplied by a supply voltage VBAT via an inductor L1, and the main amplifier 110 amplifies the input signal Vin received at a gate electrode of the NMOS M1 to generate the output signal Vout at a drain electrode of the NMOS M2. The controller 120 comprises an adjusting circuit (in this embodiment, the adjusting circuit is an adder 124), a first operational amplifier 122, a variable load RL, two NMOSs M5 and M6 and two PMOSs M7 and M8. The voltage clamp circuit 130 comprises a peak detector 136, a second operational amplifier 132 and a control transistor 134. The current clamp circuit 140 comprises two NMOSs M3 and M4, a resistor R1, a third operational amplifier 142 and a control transistor 144.

In the operations of the amplifier system 100, the power indication signal Vramp is adjusted according to the detection result Vc_Z outputted by the impedance detector 150, and the first operational amplifier 122 compares the adjusted power indication signal Vramp' with a feedback signal $V_{FB}$ to generate the control signal VGC to control the gain of the main amplifier 110, where the feedback signal $V_{FB}$ is generated according to a current of the PMOS M8 and the resistance of the variable load RL. Furthermore, the control signal VGC outputted by the first operational amplifier 122 is adjusted/clamped according to outputs of the voltage clamp circuit 130 and the current clamp circuit 140. In detail, regarding the voltage claim circuit 130, the peak detector 136 detects an amplitude of the output signal Vout to generate a voltage $V_{PS}$ representing the detected amplitude, the second operational amplifier 132 compares the voltage $V_{PS}$ with a reference voltage $V_{RV}$ to generate a compensation signal Vc_OV, and the control transistor 134 receives the compensation signal Vc_OV to adjust the control signal VGC. Regarding the current claim circuit 140, the NMOSs M3 and M4 and the resistor R1 serve as a current sensor to sense the current of the main amplifier 110 to generate a voltage $V_{IS}$ representing the sensed current, the third operational amplifier 142 compares the voltage $V_{Is}$ with the a reference voltage $V_{RI}$ to generate a compensation signal Vc_OC, and the control transistor 144 receives the compensation signal Vc_OC to adjust the control signal VGC. Furthermore, the impedance detector 150 receives the voltage $V_{PS}$ and the voltage $V_{IS}$ from the voltage clamp circuit 130 and the current clamp circuit 140, respectively, and generates the impedance Vc_Z by dividing $V_{PS}$ by $V_{IS}$ (i.e. $Vc\_z=V_{PS}/V_{IS}$).

The voltage clamp circuit 130 is used to clamp the output signal Vout within a defined voltage range. For example, if the amplitude of the output signal Vout increases, the voltage $V_{PS}$ and the compensation signal Vc_OV will also increase, thereby a current of the control transistor 134 is increased to lower the control signal VGC to lower the gain and the output signal Vout of the main amplifier 110.

The current clamp circuit 140 is used to clamp the current of the main amplifier 110 within a defined current range. For example, if the current of the main amplifier 110 increases, the voltage $V_{IS}$ and the compensation signal Vc_OC will also increase, thereby a current of the control transistor 144 is increased to lower the control signal VGC to lower the gain and the current of the main amplifier 110.

The impedance Vc_Z is provided to the adjusting circuit 124 to compensate the VSWR variation, to reduce the output power variation under different VSWR. For example, if the impedance Vc_Z increases, the power indication signal Vramp is adjusted to have a lower value (i.e. the adjusted power indication signal Vramp' is decreased), thereby the control signal VGC is decreased to lower the output power of the main amplifier 110.

By using the compensation provided by the voltage clamp circuit 130, the current clamp circuit 140 and the impedance detector 150, the amplitude of the output signal Vout and the current of the main amplifier 110 can be clamped within a defined range to prevent the IC from being damaged. In addition, by further using the impedance Vc_Z to adjust the power indication signal, the output power variation is reduced under different VSWR.

The NMOSs M5 and M6, the PMOSs M7 and M8 and the variable load RL within the controller 120 is used to control the output power of the main amplifier 110 has the linear-in-dB relation with the adjusted power indication signal Vramp'. Regarding the operations of the PMOSs M7 and M8 and the variable load RL, in the loop within the controller 120 shown in FIG. 2, when the adjusted power indication signal Vramp' changes, the current flowing through the NMOSs M5 and M6 the feedback signal VFB also continuously change until the feedback signal VFB approximates the adjusted power indication signal Vramp'. In detail, the PMOSs M7 and M8 are used to sense the current of the main amplifier 110, and a resistance of the variable load RL is determined based on the feedback signal VFB, and since the feedback signal VFB approximates the adjusted power indication signal Vramp', it is deemed that the resistance of the variable load RL is controlled by the adjusted power indication signal Vramp'. In addition, in the loop shown in FIG. 2, when the resistance of the variable load RL changes due to the change of the adjusted power indication signal Vramp', the currents of the NMOSs M5 and M6 and the main amplifier 110 also change with the resistance of the variable load RL, that is, the gain of the main amplifier 110 changes with the adjusted power indication signal Vramp'. In this embodiment, the variable load RL is designed to make the resistance have a nonlinear relation with the adjusted power indication signal Vramp', wherein the nonlinear relation may be an exponential relation or a polynomial relation such as a nonlinear decay the resistance of the variable load RL has when the adjusted power indication signal Vramp' increases.

In addition, to prevent the current sensing operation from affecting the output voltage Vout of the main amplifier, the current clamp circuit 140 senses the current of the main amplifier 110 by using dummy devices (i.e. NMOSs M3 and M4), wherein the current flowing through the dummy devices may be equal to the current of the main amplifier 110, or the current flowing through the dummy devices may have a predetermined ratio to the current of the main amplifier 110. The sensed current from the dummy devices can be used to represent the current of the main amplifier 110. Similarly, the PMOSs M7 and M8 within the controller 120 also sense the current of the main amplifier 110 by using dummy devices (i.e. NMOSs M5 and M6) to prevent the NMOSs M7 and M8 from affecting the output voltage Vout of the main amplifier.

Figure 3:
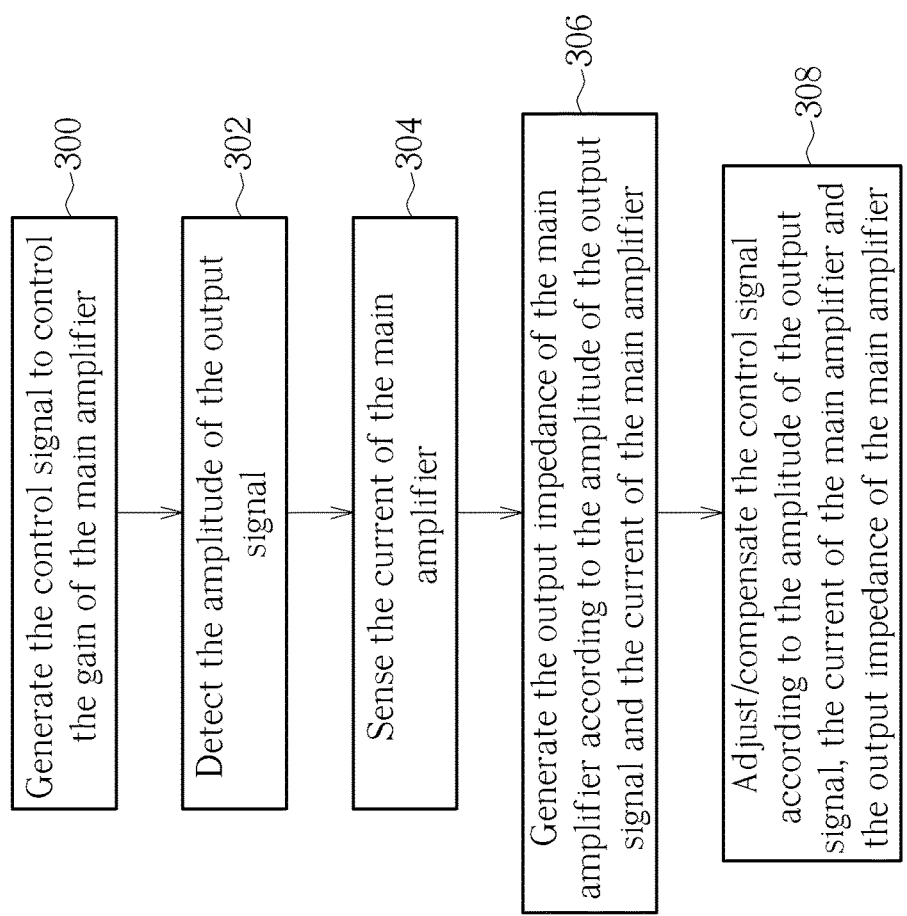
FIG. 3 is a flowchart of a method for controlling the main amplifier according to one embodiment of the present invention.

FIG. 3 is a flowchart of a method for controlling the main amplifier 110 according to one embodiment of the present invention. Referring to FIGS. 1-3 together, the flow is described as follows:

Step 300: generate the control signal to control the gain of the main amplifier.

Step 302: detect the amplitude of the output signal.

Step 304: sense the current of the main amplifier.

Step 306: generate the output impedance of the main amplifier according to the amplitude of the output signal and the current of the main amplifier.

Step 308: adjust/compensate the control signal according to the amplitude of the output signal, the current of the main amplifier and the output impedance of the main amplifier.

Briefly summarized, in the amplifier system of the present invention, the cascode power amplifier can be controlled to generate output signal Vout with desired power/voltage/current. Therefore, the output signal Vout is robust to the VSWR variation.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An amplifier system, comprising:
   a main amplifier comprising a first transistor and a second transistor coupled in cascode, wherein the main amplifier receives an input signal and outputs an output signal;
   a controller, coupled to the main amplifier, for generating a control signal according to the output signal and a current of the main amplifier, to control a gain of the main amplifier; and
   a current clamp circuit, coupled to the main amplifier and the controller, for sensing the current of the main amplifier, and adjusting the control signal according to the sensed current, to clamp the current of the main amplifier within a defined current range.

2. The amplifier system of claim 1, wherein the main amplifier amplifies the input signal at a gate electrode of the first transistor to generate the output signal at a drain electrode of the second transistor, and the controller generates the control signal to a gate electrode of the second transistor to control the gain of the main amplifier.

3. The amplifier system of claim 1, further comprising:
   a voltage clamp circuit, coupled to the main amplifier and the controller, for detecting an amplitude of the output signal, and adjusting the control signal according to the amplitude of the output signal, to clamp the output signal within a defined voltage range.

4. The amplifier system of claim 3, wherein the controller comprises:
   a first operational amplifier, for receiving a power indication signal and a feedback signal to generate the control signal; and
   the voltage clamp circuit comprises:
     a peak detector, for detecting the amplitude of the output signal;
     a second operational amplifier, for receiving the amplitude of the output signal and a reference voltage to generate a compensation signal; and
     a control transistor, coupled to an output node of the first operational amplifier, for adjusting the control signal according to the compensation signal.

5. The amplifier system of claim 1, wherein the current clamp circuit senses the current of the main amplifier by using dummy devices.

6. The amplifier system of claim 1, wherein the controller comprises:
   a first operational amplifier, for receiving a power indication signal and a feedback signal to generate the control signal; and
   the current clamp circuit comprises:
     a current sensor, for sensing the current of the main amplifier to generate a voltage representing the sensed current;
     a third operational amplifier, for receiving the voltage and a reference voltage to generate a compensation signal; and
     a control transistor, coupled to an output node of the first operational amplifier, for adjusting the control signal according to the compensation signal.

7. The amplifier system of claim 1, further comprising:
   an impedance detector, for generating an output impedance of the main amplifier according to an amplitude of the output signal and the current of the main amplifier;
   wherein the controller generates the control signal to the gate electrode of the second transistor according to the output impedance of the main amplifier.

8. The amplifier system of claim 7, wherein when the output impedance increases, the controller generates the control signal to the gate electrode of the second transistor to lower the gain of the main amplifier.

9. The amplifier system of claim 7, wherein the controller comprises:
   an adjusting circuit, for receiving a power indication signal and adjusting the power indication signal according to the output impedance of the main amplifier; and
   a first operational amplifier, coupled to the adjusting circuit, for receiving the adjusted power indication signal and a feedback signal to generate the control signal.

10. A method for controlling a main amplifier, wherein the main amplifier comprises a first transistor and a second transistor coupled in cascode, the main amplifier receives an input signal and outputs an output signal, and the method comprises:
    generating a control signal according to the output signal and a current of the main amplifier, to control a gain of the main amplifier;
    sensing the current of the main amplifier; and
    adjusting the control signal according to the sensed current, to clamp the current of the main amplifier within a defined current range.

11. The method of claim 10, further comprising:
    detecting an amplitude of the output signal; and
    adjusting the control signal according to the amplitude of the output signal, to clamp the output signal within a defined voltage range.

12. The method of claim 11, wherein the step of generating the control signal comprises:
    using a first operational amplifier to receive a power indication signal and a feedback signal to generate the control signal; and
    the step of adjusting the control signal comprises:
      detecting the amplitude of the output signal;
      using a second operational amplifier to receive the amplitude of the output signal and a reference voltage to generate a compensation signal; and
      adjusting the control signal according to the compensation signal.

13. The method of claim 10, wherein the step of generating the control signal comprises:
    using a first operational amplifier to receive a power indication signal and a feedback signal to generate the control signal; and
    the step of adjusting the control signal comprises:
      sensing the current of the main amplifier to generate a voltage representing the sensed current;
      using a third operational amplifier to receive the voltage and a reference voltage to generate a compensation signal; and
      adjusting the control signal according to the compensation signal.

14. The method of claim 10, further comprising:
    generating an output impedance of the main amplifier according to an amplitude of the output signal and the current of the main amplifier; and
    the step of generating the control signal comprises:
      generating the control signal to the gate electrode of the second transistor according to the output impedance of the main amplifier.

15. The method of claim 14, wherein the step of generating the control signal comprises:
when the output impedance increases, generating the control signal to the gate electrode of the second transistor to lower the gain of the main amplifier.

16. The method of claim 14, wherein the step of generating the control signal comprises:
adjusting a power indication signal according to the output impedance of the main amplifier; and
using a first operational amplifier to receive the adjusted power indication signal and a feedback signal to generate the control signal.

17. The amplifier system of claim 1, wherein the main amplifier receives the input signal using the first transistor and outputs the output signal using the second transistor, and the controller generating the control signal to the second transistor to control the gain of the main amplifier.

18. The method of claim 10, wherein the main amplifier receives the input signal using the first transistor and outputs the output signal using the second transistor, and the control signal is generated to the second transistor to control the gain of the main amplifier.

19. An amplifier system, comprising:
a main amplifier comprising a first transistor and a second transistor coupled in cascode, wherein the main amplifier receives an input signal and outputs an output signal;
a controller, coupled to the main amplifier, for generating a control signal according to the output signal and a current of the main amplifier, to control a gain of the main amplifier;
a voltage clamp circuit, coupled to the main amplifier and the controller, for detecting an amplitude of the output signal, and adjusting the control signal according to the amplitude of the output signal, to clamp the output signal within a defined voltage range;
wherein the controller comprises:
a first operational amplifier, for receiving a power indication signal and a feedback signal to generate the control signal; and
the voltage clamp circuit comprises:
a peak detector, for detecting the amplitude of the output signal;
a second operational amplifier, for receiving the amplitude of the output signal and a reference voltage to generate a compensation signal; and
a control transistor, coupled to an output node of the first operational amplifier, for adjusting the control signal according to the compensation signal.

20. The amplifier system of claim 19, wherein the main amplifier amplifies the input signal at a gate electrode of the first transistor to generate the output signal at a drain electrode of the second transistor, and the controller generates the control signal to a gate electrode of the second transistor to control the gain of the main amplifier.

21. The amplifier system of claim 19, further comprising:
a current clamp circuit, coupled to the main amplifier and the controller, for sensing the current of the main amplifier, and adjusting the control signal according to the sensed current, to clamp the current of the main amplifier within a defined current range.

22. The amplifier system of claim 19, further comprising:
an impedance detector, for generating an output impedance of the main amplifier according to an amplitude of the output signal and the current of the main amplifier;
wherein the controller generates the control signal to the gate electrode of the second transistor according to the output impedance of the main amplifier.

23. An amplifier system, comprising:
a main amplifier comprising a first transistor and a second transistor coupled in cascode, wherein the main amplifier receives an input signal and outputs an output signal;
a controller, coupled to the main amplifier, for generating a control signal according to the output signal and a current of the main amplifier, to control a gain of the main amplifier;
an impedance detector, for generating an output impedance of the main amplifier according to an amplitude of the output signal and the current of the main amplifier;
wherein the controller generates the control signal to the gate electrode of the second transistor according to the output impedance of the main amplifier, and the controller comprises:
an adjusting circuit, for receiving a power indication signal and adjusting the power indication signal according to the output impedance of the main amplifier; and
a first operational amplifier, coupled to the adjusting circuit, for receiving the adjusted power indication signal and a feedback signal to generate the control signal.

24. The amplifier system of claim 23, wherein when the output impedance increases, the controller generates the control signal to the gate electrode of the second transistor to lower the gain of the main amplifier.

25. A method for controlling a main amplifier, wherein the main amplifier comprises a first transistor and a second transistor coupled in cascode, the main amplifier receives an input signal and outputs an output signal, and the method comprises:
generating a control signal according to the output signal and a current of the main amplifier, to control a gain of the main amplifier;
detecting an amplitude of the output signal; and
adjusting the control signal according to the amplitude of the output signal, to clamp the output signal within a defined voltage range; and
the step of generating the control signal comprises:
using a first operational amplifier to receive a power indication signal and a feedback signal to generate the control signal; and
the step of adjusting the control signal comprises:
detecting the amplitude of the output signal;
using a second operational amplifier to receive the amplitude of the output signal and a reference voltage to generate a compensation signal; and
adjusting the control signal according to the compensation signal.

26. The method of claim 25, further comprising:
sensing the current of the main amplifier; and
adjusting the control signal according to the sensed current, to clamp the current of the main amplifier within a defined current range.

27. The method of claim 25, further comprising:
generating an output impedance of the main amplifier according to an amplitude of the output signal and the current of the main amplifier; and
the step of generating the control signal comprises:
generating the control signal to the gate electrode of the second transistor according to the output impedance of the main amplifier.

28. A method for controlling a main amplifier, wherein the main amplifier comprises a first transistor and a second transistor coupled in cascode, the main amplifier receives an input signal and outputs an output signal, and the method comprises:
    generating a control signal according to the output signal and a current of the main amplifier, to control a gain of the main amplifier; and
    generating an output impedance of the main amplifier according to an amplitude of the output signal and the current of the main amplifier; and
    the step of generating the control signal comprises:
        adjusting a power indication signal according to the output impedance of the main amplifier; and
        using a first operational amplifier to receive the adjusted power indication signal and a feedback signal to generate the control signal.

29. The method of claim 28, wherein the step of generating the control signal comprises:
    when the output impedance increases, generating the control signal to the gate electrode of the second transistor to lower the gain of the main amplifier.

30. An amplifier system, comprising:
    a main amplifier comprising a first transistor and a second transistor coupled in cascode, wherein the main amplifier receives an input signal and outputs an output signal;
    a controller, coupled to the main amplifier, for generating a control signal according to the output signal and a current of the main amplifier, to control a gain of the main amplifier;
    an impedance detector, for generating an output impedance of the main amplifier according to an amplitude of the output signal and the current of the main amplifier;
    wherein the controller generates the control signal to the gate electrode of the second transistor according to the output impedance of the main amplifier; and when the output impedance increases, the controller generates the control signal to the gate electrode of the second transistor to lower the gain of the main amplifier;
    wherein the controller comprises:
        an adjusting circuit, for receiving a power indication signal and adjusting the power indication signal according to the output impedance of the main amplifier; and
        an operational amplifier, coupled to the adjusting circuit, for receiving the adjusted power indication signal to generate the control signal.

31. A method for controlling a main amplifier, wherein the main amplifier comprises a first transistor and a second transistor coupled in cascode, the main amplifier receives an input signal and outputs an output signal, and the method comprises:
    generating a control signal according to the output signal and a current of the main amplifier, to control a gain of the main amplifier;
    generating an output impedance of the main amplifier according to an amplitude of the output signal and the current of the main amplifier; and
    the step of generating the control signal comprises:
        adjusting a power indication signal according to the output impedance of the main amplifier; and
        using an operational amplifier to receive the adjusted power indication signal to generate the control signal to the gate electrode of the second transistor according to the output impedance of the main amplifier, wherein when the output impedance increases, generating the control signal to the gate electrode of the second transistor to lower the gain of the main amplifier.

* * * * *